US009129353B2

(12) United States Patent
Shirai et al.

(10) Patent No.: US 9,129,353 B2
(45) Date of Patent: Sep. 8, 2015

(54) CHARGED PARTICLE BEAM DEVICE, AND IMAGE ANALYSIS DEVICE

(75) Inventors: Masumi Shirai, Hitachinaka (JP); Osamu Komuro, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 75 days.

(21) Appl. No.: 13/980,481

(22) PCT Filed: Jan. 19, 2012

(86) PCT No.: PCT/JP2012/051044
§ 371 (c)(1),
(2), (4) Date: Jul. 18, 2013

(87) PCT Pub. No.: WO2012/099190
PCT Pub. Date: Jul. 26, 2012

(65) Prior Publication Data
US 2013/0301954 A1 Nov. 14, 2013

(30) Foreign Application Priority Data
Jan. 21, 2011 (JP) .................................. 2011-010351

(51) Int. Cl.
*G06K 9/36* (2006.01)
*G06T 7/00* (2006.01)
*H01J 37/28* (2006.01)

(52) U.S. Cl.
CPC ................ *G06T 7/0004* (2013.01); *H01J 37/28* (2013.01); *H01J 2237/0216* (2013.01);
(Continued)

(58) Field of Classification Search
USPC .......... 382/277, 280, 145, 276, 318; 250/310, 250/311, 306, 307, 252.1, 398, 442.11, 250/492.21; 348/80
See application file for complete search history.

(56) References Cited

U.S. PATENT DOCUMENTS 7,285,778 B2 * 10/2007 Baur et al. ..................... 250/310
7,504,624 B2 * 3/2009 Kawasaki et al. ............. 250/310
(Continued)

FOREIGN PATENT DOCUMENTS

JP 63-307652 A 12/1988
JP 06-188181 A 7/1994
(Continued)

OTHER PUBLICATIONS

Japanese Office Action with partial translation issued in Japanese Application No. 2011-010351 issued on Dec. 3, 2013.
(Continued)

*Primary Examiner* — Anh Do
(74) *Attorney, Agent, or Firm* — McDermott Will & Emery LLP

(57) ABSTRACT

In a scanning electron microscope, if a failure is caused to occur in a SEM image by the influence of a disturbance such as magnetic field or vibration inside and from outside the device, the cause is identified simply and accurately using this SEM image. There is provided a measurement technique whose measurement accuracy is not influenced by a roughness of SEM image pattern. A one-dimensional scanning is performed in a scanning-line direction (X direction) by setting the Y-direction scanning gain at zero at the time of acquiring the SEM image, and a two-dimensional image is created by arranging image information, which is obtained by the scanning, in a time-series manner in the Y direction. A shift-amount data on the two-dimensional image is acquired using a correlation function, and the magnetic field or vibration included within the SEM image is measured by a frequency analysis of the data.

9 Claims, 16 Drawing Sheets

(52) U.S. Cl.
CPC ............. *H01J 2237/24528* (2013.01); *H01J 2237/24578* (2013.01); *H01J 2237/2803* (2013.01); *H01J 2237/2809* (2013.01); *H01J 2237/2817* (2013.01); *H01J 2237/2826* (2013.01)

(56) References Cited

U.S. PATENT DOCUMENTS

| | | | |
|---|---|---|---|
| 7,633,064 B2 * | 12/2009 | Tsuneta et al. | 250/310 |
| 8,311,314 B2 * | 11/2012 | Matsuoka et al. | 382/145 |
| 8,421,010 B2 * | 4/2013 | Hiroi et al. | 250/310 |
| 8,610,800 B2 | 12/2013 | Ikedo | |
| 8,766,183 B2 * | 7/2014 | Fukuda et al. | 250/310 |
| 8,848,049 B2 * | 9/2014 | Kamio et al. | 348/80 |
| 2005/0121610 A1 | 6/2005 | Abe | |
| 2008/0197280 A1 | 8/2008 | Tanaka et al. | |
| 2011/0254944 A1 | 10/2011 | Ishitani et al. | |

FOREIGN PATENT DOCUMENTS

| | | |
|---|---|---|
| JP | 2002-217086 A | 8/2002 |
| JP | 2002-243428 A | 8/2002 |
| JP | 2005-116795 A | 4/2005 |
| JP | 2008-203109 A | 9/2008 |
| JP | 2010-092634 A | 4/2010 |
| JP | 2010-135017 A | 6/2010 |
| KR | 10-2010-0020424 A | 2/2010 |
| WO | WO-2010/041392 A1 | 4/2010 |

OTHER PUBLICATIONS

International Search Report in PCT/JP2012/051044 dated May 1, 2012 with English Translation.

Korean Office Action, w/ partial English translation thereof, issued in Korean Patent Application No. KR 10-2013-7018947 dated Jun. 27, 2014.

* cited by examiner (a)　　　　　　　　　　(b)

| | X-DIRECTION VIBRATION | Y-DIRECTION VIBRATION |
|---|---|---|
| 0° SCAN | IMAGE'S WARP IN WITHIN-SCREEN X DIRECTION | IMAGE'S NONUNIFORMITY IN WITHIN-SCREEN Y DIRECTION |
| 90° SCAN | IMAGE'S NONUNIFORMITY IN WITHIN-SCREEN Y DIRECTION | IMAGE'S WARP IN WITHIN-SCREEN X DIRECTION |

FIG.19

|  | IN CASE OF 50 Hz | IN CASE OF 60 Hz |
|---|---|---|
| 1-FRAME TIME (F) | 320ms | 266.6ms |
| SCANNING-LINE TIME-INTERVAL (T) | 606.94us | 505.79us |
| SAMPLING FREQUENCY (f = 1/T) | 1647.6 | 1977.1 |
| OBSERVABLE UPPER-LIMIT FREQUENCY (f/2) | 823.8Hz | 988.5Hz |
| OBSERVABLE LOWER-LIMIT FREQUENCY (1/(F/6)) (IT IS ASSUMED THAT FREQUENCY ANALYSIS REQUIRES 6 PERIODS) | 19Hz | 23Hz |

CHARGED PARTICLE BEAM DEVICE, AND IMAGE ANALYSIS DEVICE

RELATED APPLICATIONS

This application is the U.S. National Phase under 35 U.S.C. §371 of International Application No. PCT/JP2012/051044, filed on Jan. 19, 2012, which in turn claims the benefit of Japanese Application No. 2011-010351, filed on Jan. 21, 2011, the disclosures of which Applications are incorporated by reference herein.

TECHNICAL FIELD

The present invention relates to a charged-particle beam device. More specifically, it relates to a method and a device for evaluating an external disturbance, such as magnetic field or vibration, by using a signal waveform. Here, this signal waveform is formed based on charged particles such as electrons, which are acquired by scanning a sample with a charged-particle beam such as an electron beam.

BACKGROUND ART

In charged-particle beam devices, the representative of which is a scanning electron microscope (: SEM), it is necessary for their high-resolution implementation to irradiate the surface of a sample with a stable electron beam. For example, in a semiconductor critical-dimension measurement device where the SEM is utilized, there has been a significant request for even more stable irradiation with the electron beam. Here, this request has been made in accompaniment with the microminiaturization in the dimension of a measurement pattern in recent years.

In the semiconductor critical-dimension measurement device, the dimension of a measurement pattern is measured as follows: Namely, the measurement pattern is scanned with an electron beam. Moreover, a signal of secondary electrons generated from the sample is detected, then being formed into a SEM image. Finally, the above-described dimension is measured based on this SEM image. If, however, the measurement device is set up at a location whose external environment is undesirable, there exists the following possibility: Namely, an influence exerted by an external disturbance (such as magnetic field or vibration) will disturb a relative deflection of the electron beam with respect to the sample, thereby giving rise to the occurrence of an image failure. Also, if the set-up condition is undesirable, there also exists the following possibility: Namely, a magnetic field or vibration, which is generated by the measurement device' main body itself, will also exerts an influence onto the image formation or measurement. Then, the occurrence of the image failure results in the occurrence of a lowering in sharpness of the SEM image, or the occurrence of a distortion of the SEM image. As a result, it becomes difficult to make the stable measurement on the dimension.

In PATENT LITERATURE 1, the disclosure has been made concerning a technique for correcting a shift of the electron beam's irradiation position. Here, this position-shift correction is made by setting up, outside the electron-beam irradiation device, a magnetic-field detector for measuring an external magnetic field as described above. Also, in PATENT LITERATURE 2, the explanation has been given regarding a technique for correcting a deflection signal. Here, this deflection-signal correction is made as follows: Namely, a vibration gauge for detecting the vibration is set up outside the charged-particle beam device. Moreover, the measurement on the vibration is made, then correcting the deflection signal on the basis of vibration information acquired by this measurement. Furthermore, in PATENT LITERATURE 3, the explanation has been given concerning a technique for making the analysis of the external disturbance or the like by making the fast-Fourier-transform (: FFT) analysis of the SEM image.

CITATION LIST

Patent Literature

PATENT LITERATURE 1: JP-A-2002-217086
PATENT LITERATURE 2: JP-A-6-188181
PATENT LITERATURE 3: JP-A-2010-92634

SUMMARY OF INVENTION

Technical Problem

According to the magnetic-field-detector or vibration-gauge-based external-disturbance detection method as explained in PATENT LITERATURE 1 or 2, the influence exerted onto the electron beam due to the influence exerted by the magnetic field or vibration can be identified to some extent. In this case, however, the influence exerted onto the electron beam is not detected directly. Accordingly, a high position-shift correction accuracy cannot be desired. Meanwhile, according to the image-based external-disturbance measurement technique explained in PATENT LITERATURE 3, the external disturbance is measured using the image, i.e., the output data from the SEM. Consequently, the external disturbance can be measured with a more or less reasonable accuracy. In this case, however, the measurement accuracy varies depending on a pattern to be used for the analysis. For example, a distortion of the pattern shape, which is referred to as "roughness", exists in the pattern formed on a semiconductor device. Since the SEM image includes this roughness, there exists the following possibility: Namely, eventually, the roughness component will also be detected as a partial component of the external disturbance.

Hereinafter, the explanation will be given below concerning a charged-particle beam device and an image analysis device whose object is as follows: Namely, the high-accuracy evaluation of an external disturbance is performed independently of a pattern shape or the like formed on a sample. Otherwise, the high-accuracy image formation or measurement is performed regardless of the external disturbance.

Solution to Problem

As one aspect for accomplishing the above-described object, the proposal is made concerning the following charged-particle beam device and image analysis device: Namely, each device displays or arranges detection signals in a two-dimensional manner, the detection signals being obtained by performing a scanning with a charged-particle beam in a one-dimensional manner and in plural times. Moreover, a frequency analysis or the like is applied to edge information on the resultant two-dimensional data.

Advantageous Effects of Invention

According to the above-described one aspect, the information for the evaluation of an external disturbance or the like can be acquired based on the detection signals that are obtained by performing the charged-particle-beam scanning in a one-dimensional manner and in plural times. As a result, the evaluation of the external disturbance or the like can be performed with a high accuracy, and regardless of the presence of a roughness or the like formed in the pattern.

The other objects, features and advantages of the present invention will become apparent from the following description of embodiments of the present invention associated with the accompanying drawings.

BRIEF DESCRIPTION OF DRAWINGS

The FIG. 1 is a schematic configuration diagram of a scanning electron microscope.

The FIG. 2 is a flowchart for illustrating steps through which an external disturbance is evaluated by using information that is obtained based on an electron-beam scanning onto a sample.

Figure 3:
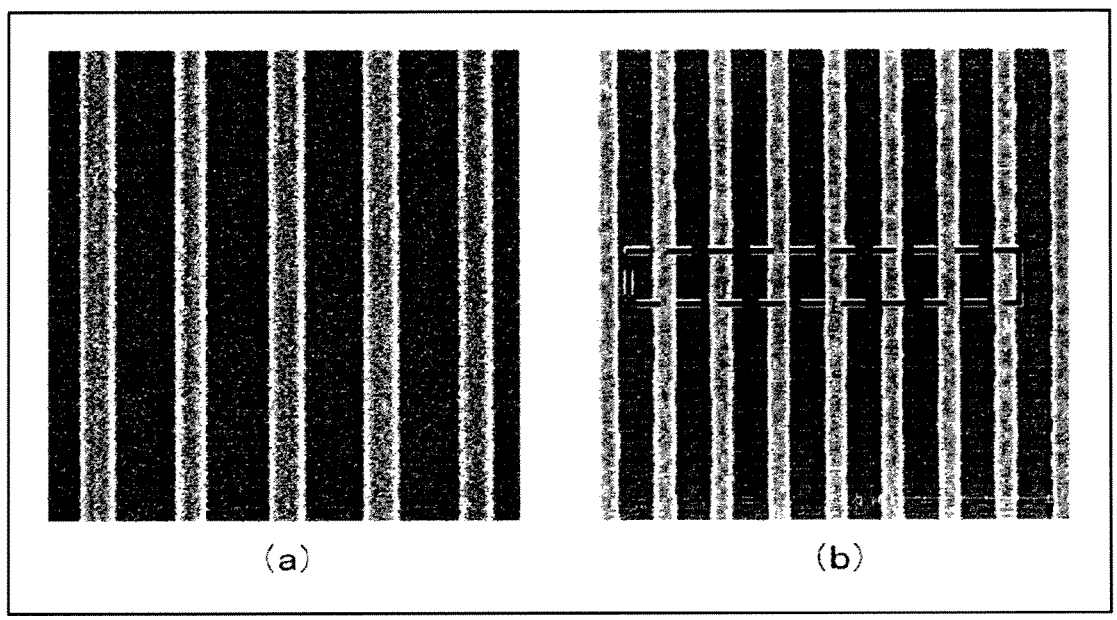

The FIG. 3 is a diagram for illustrating an example of the image that is formed by arranging detection signals in a two-dimensional manner, the detection signals being obtained based on a one-dimensional scanning with an electron beam.

Figure 4:
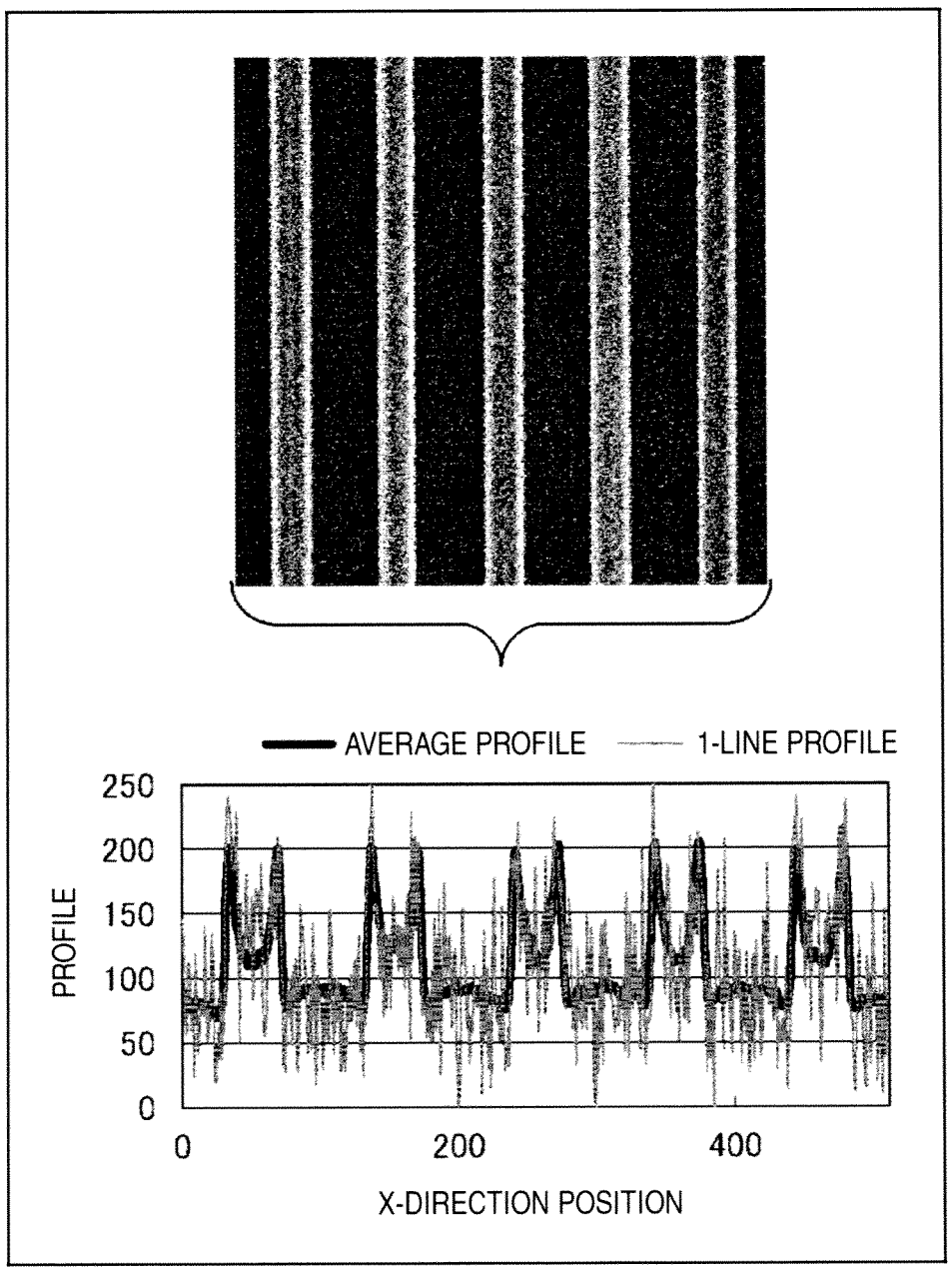

The FIG. 4 is a diagram for illustrating the relationship between the profile of a two-dimensionally-expanded image and the profile of a two-dimensional image.

Figure 5:
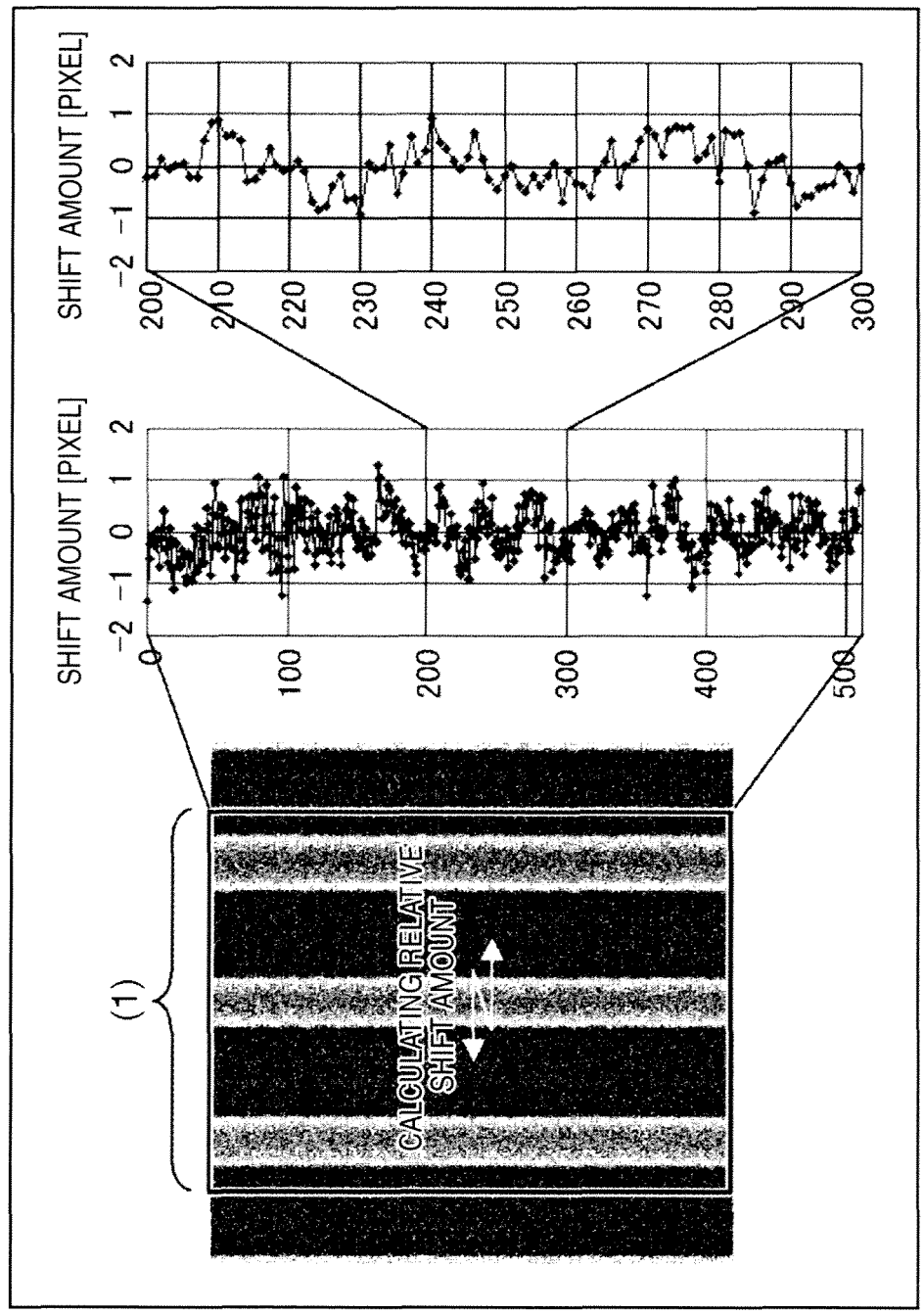

The FIG. 5 is a diagram for illustrating an example where the relative position shift of the edge portion is calculated from the two-dimensionally-expanded image.

Figures 6, 7:
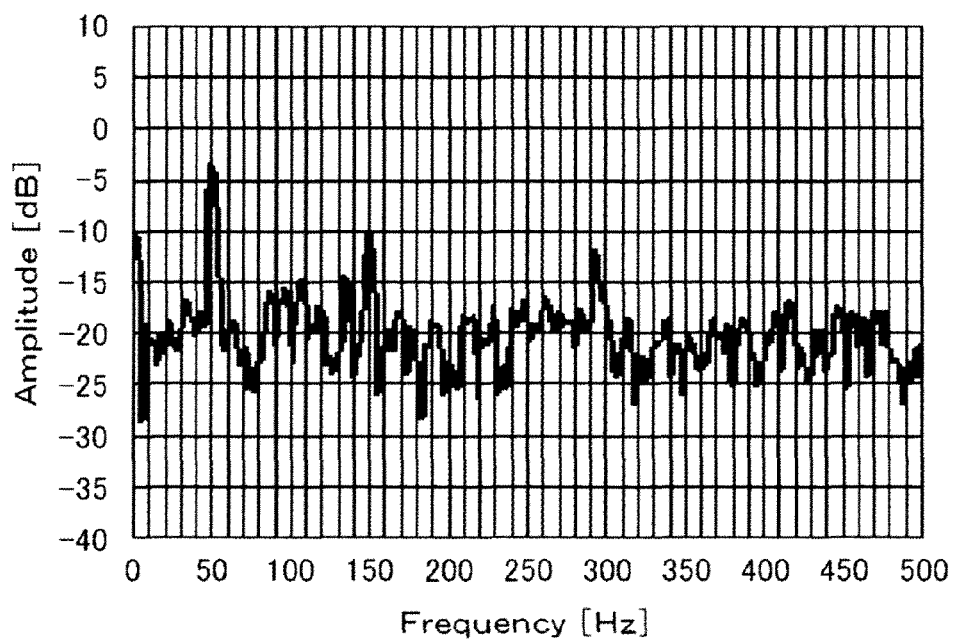

The FIG. 6 is a diagram for illustrating the measurement result of the noise component contained in the two-dimensionally-expanded image.

The FIG. 7 is a diagram for illustrating influences exerted onto the SEM image by noises in the X direction and the Y direction.

Figure 8:
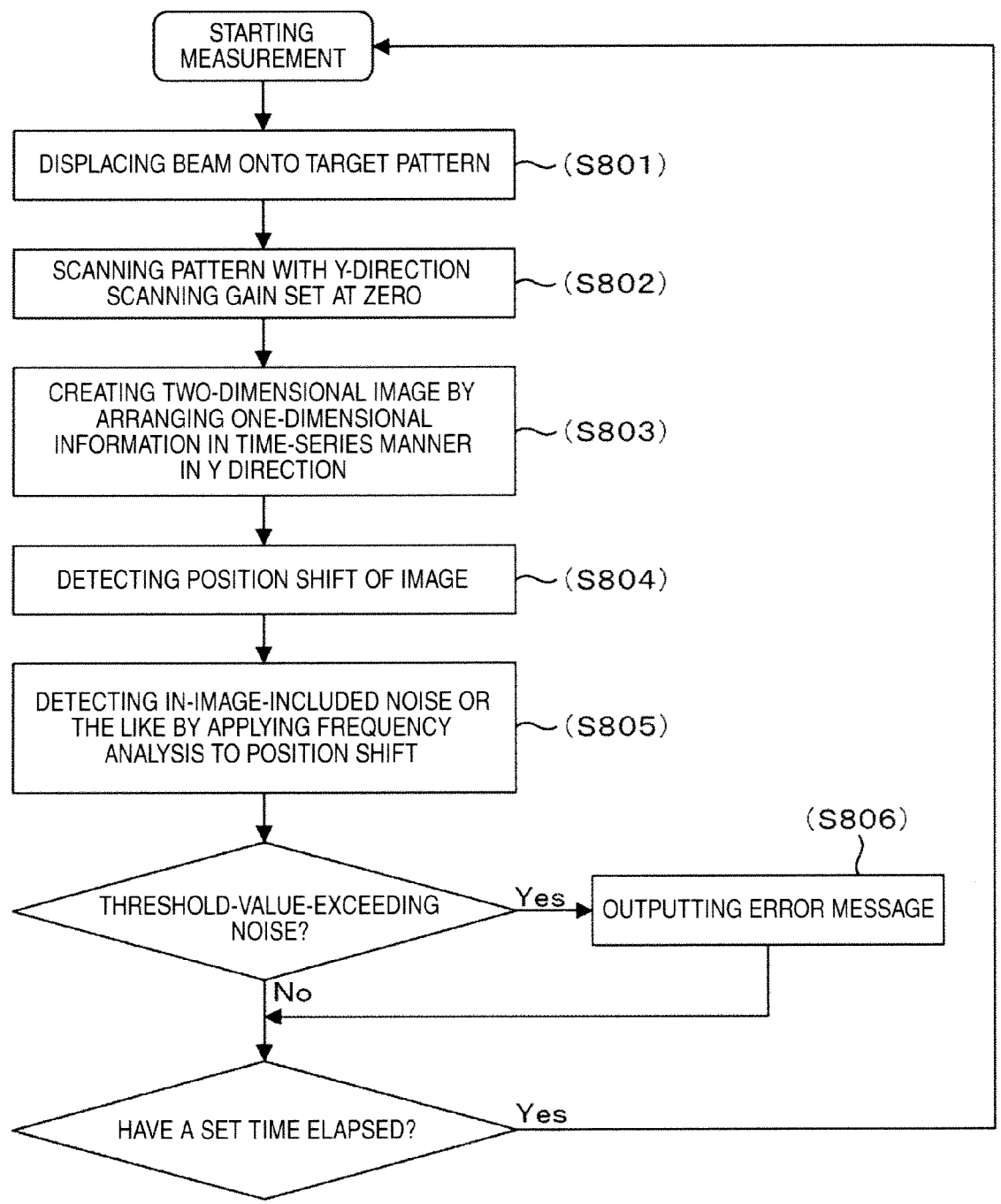

The FIG. 8 is a flowchart for illustrating steps through which an error message is generated based on the result of the noise evaluation.

Figure 9:
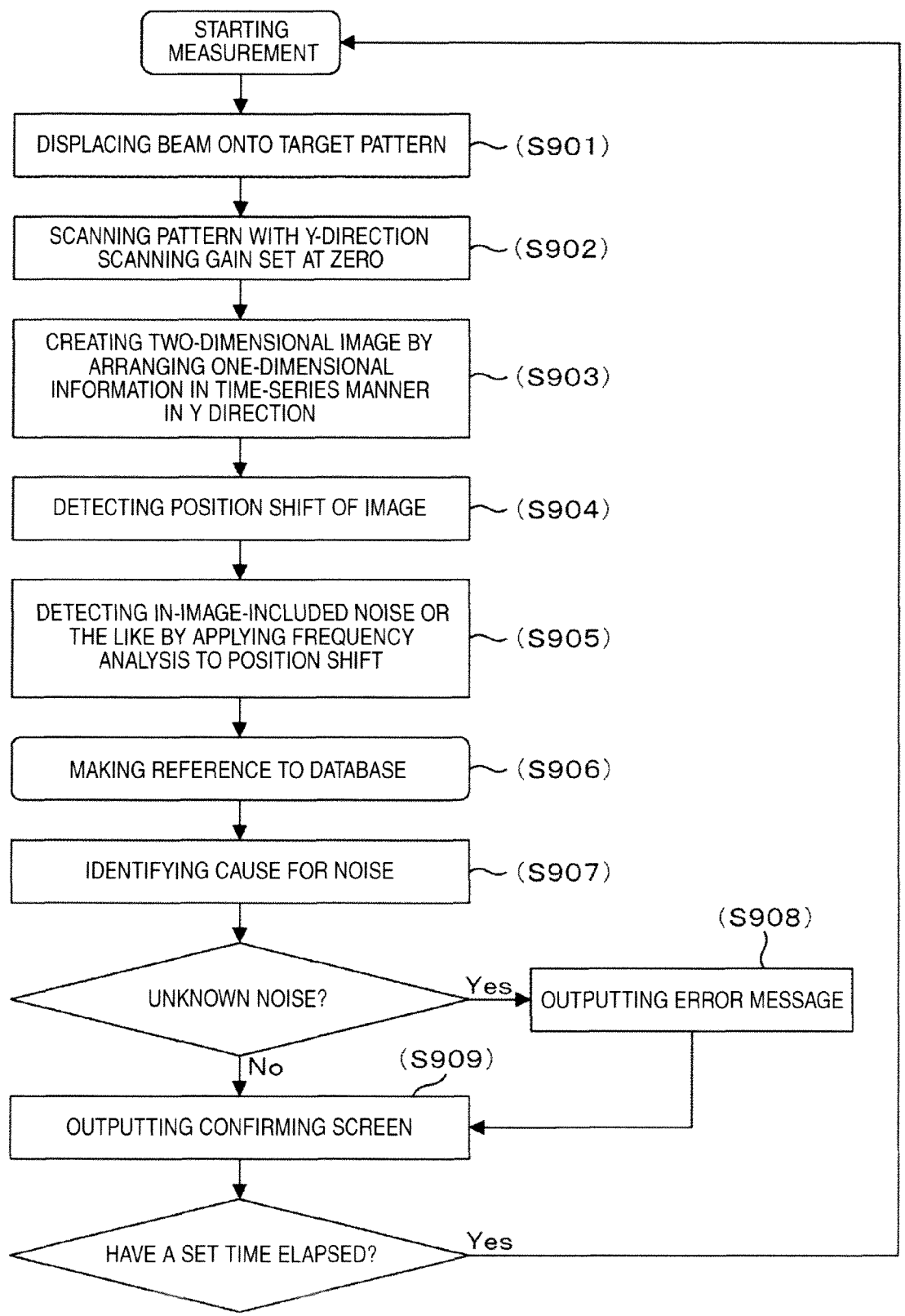

The FIG. 9 is a flowchart for illustrating steps through which the error message is generated when an unknown noise is detected.

Figure 10:
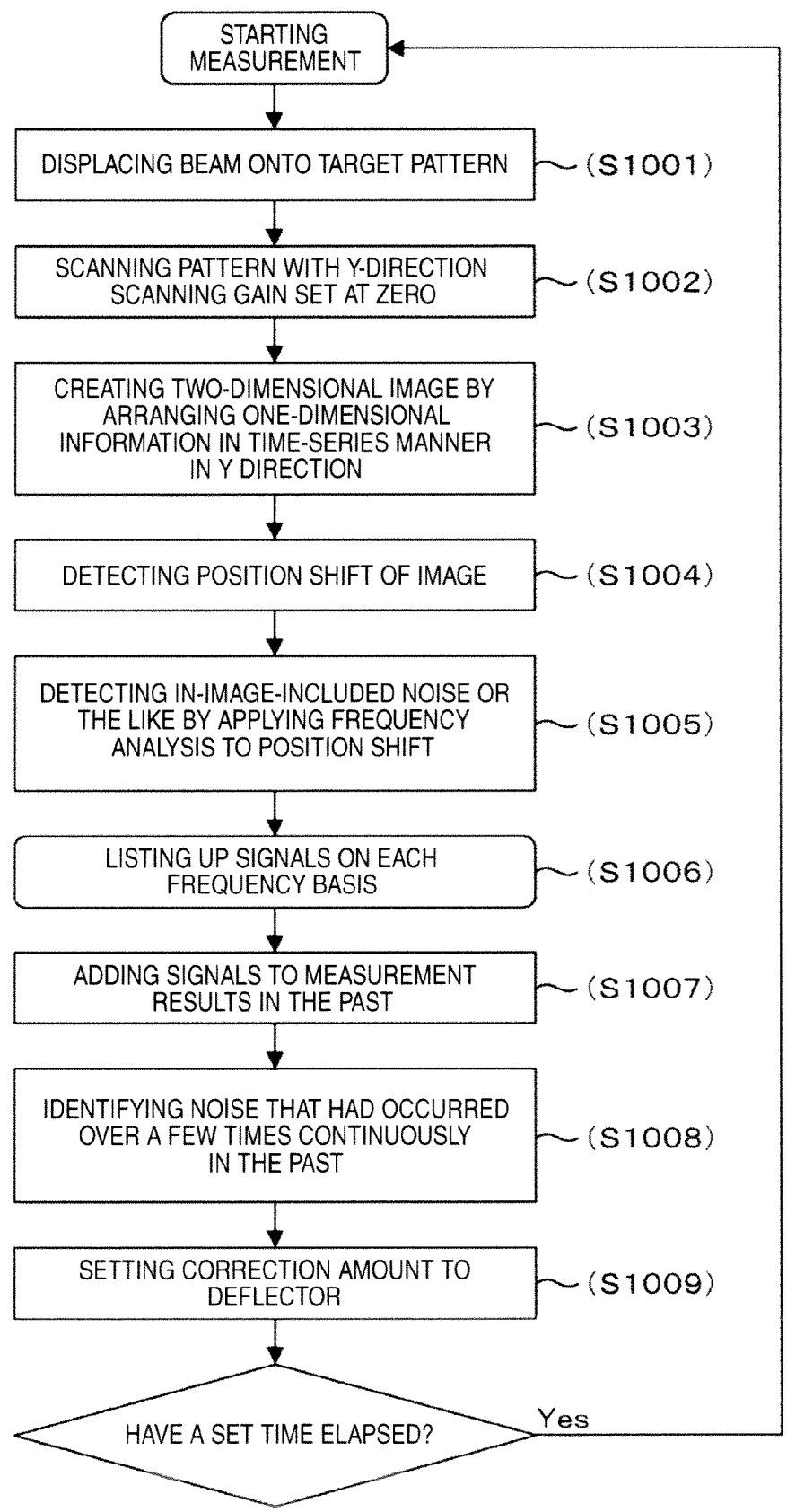

The FIG. 10 is a flowchart for illustrating steps through which the correction amount for the deflector is determined based on the result of the noise evaluation.

Figure 11:
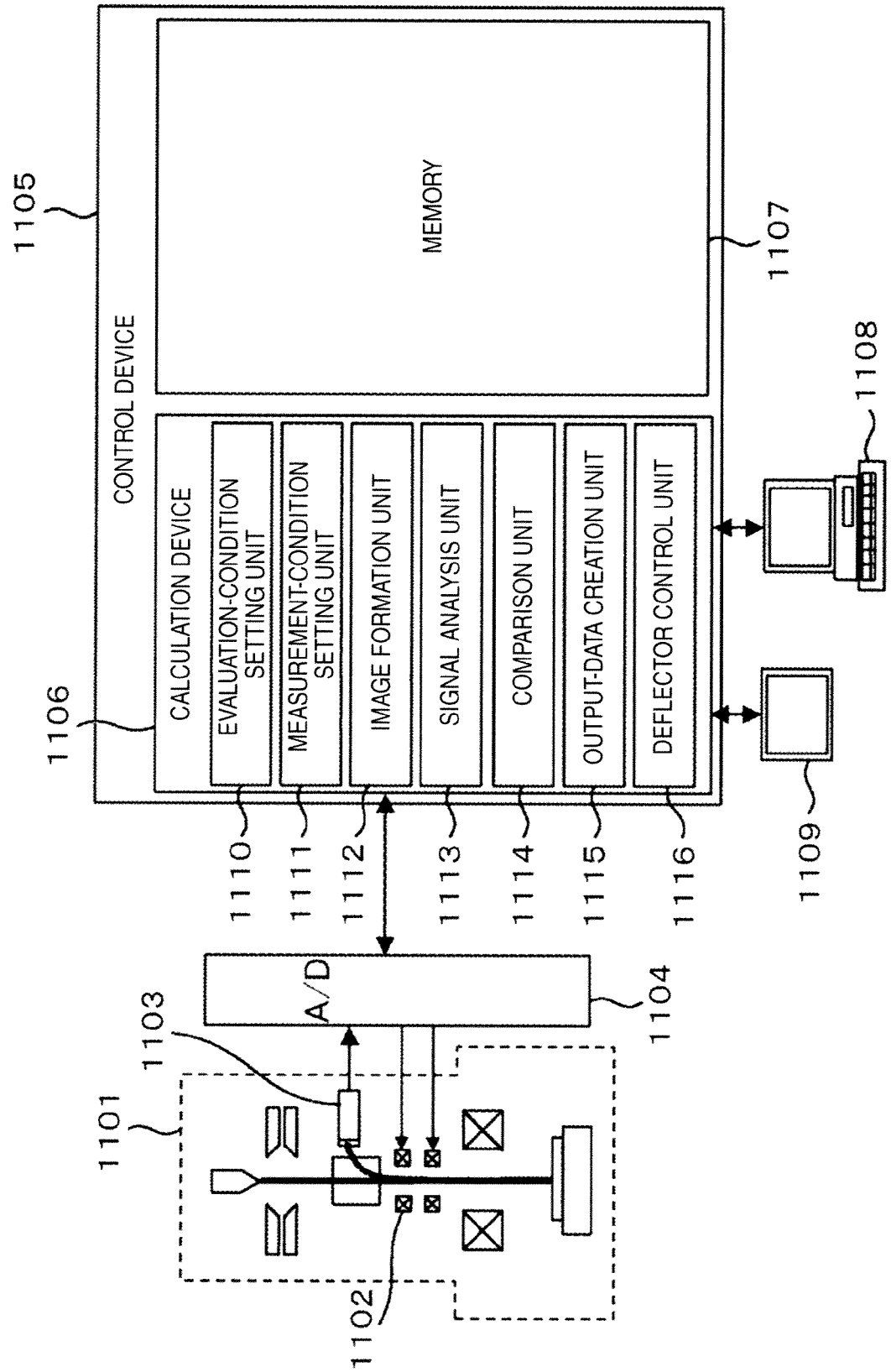

The FIG. 11 is a schematic diagram of a semiconductor measurement/inspection system including a SEM.

Figure 12:
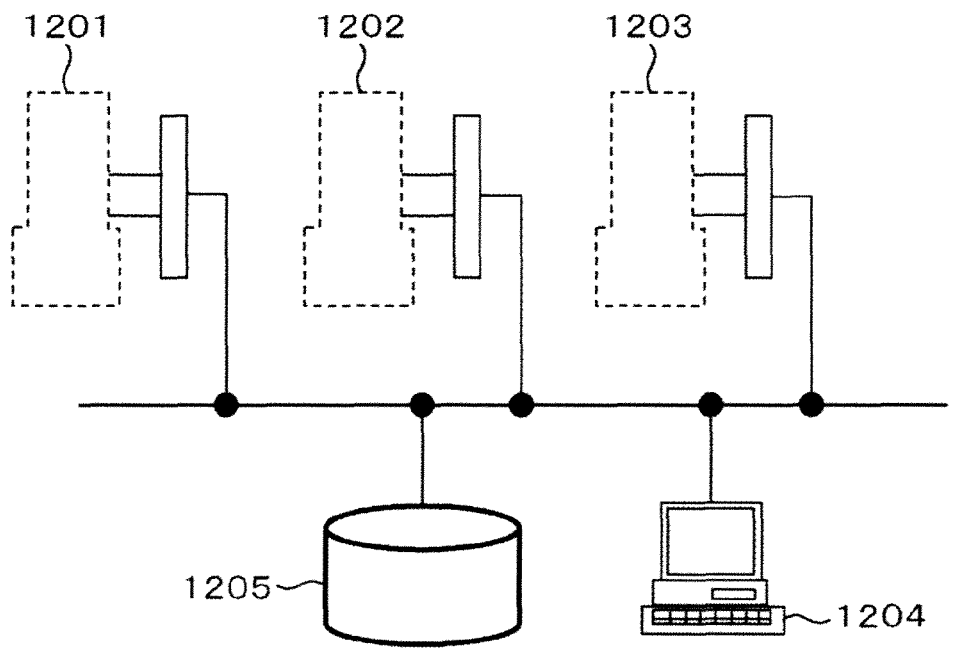

The FIG. 12 is a schematic diagram of a semiconductor measurement/inspection system including a plurality of SEMs.

Figure 13:
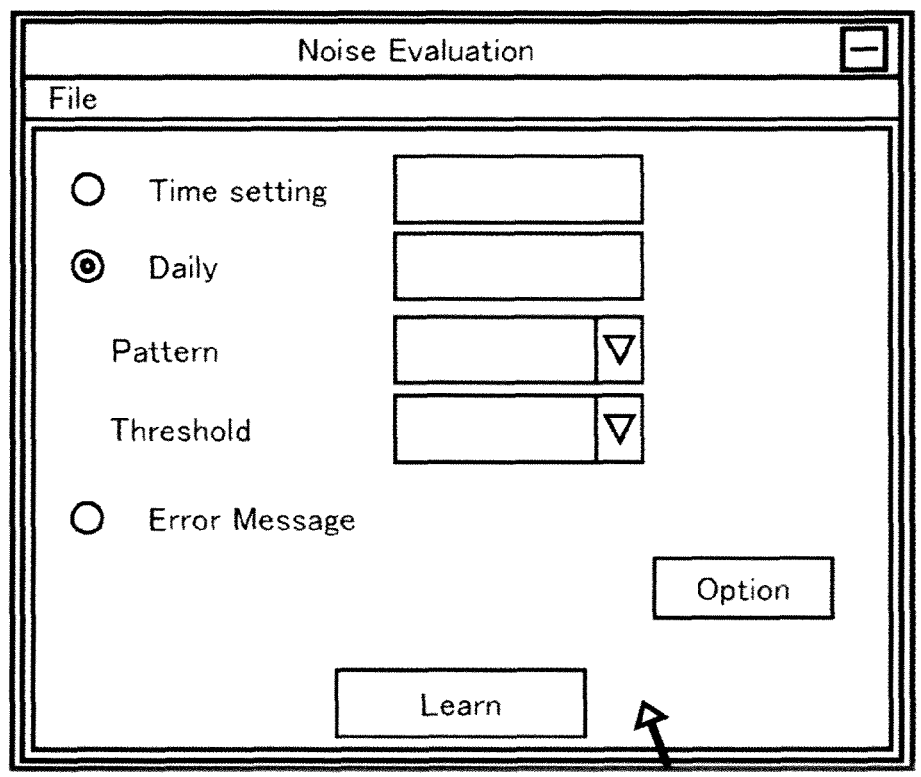

The FIG. 13 is a diagram for illustrating an example of the GUI screen for performing a condition setting for the noise evaluation.

Figure 14:
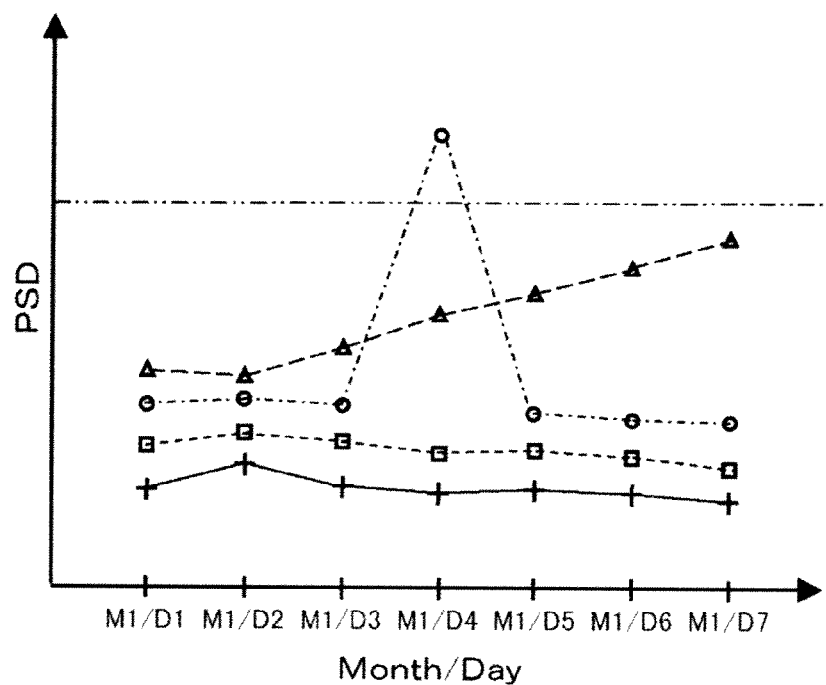

The FIG. 14 is a graph for illustrating a change in the signal amount of a specific frequency obtained based on the two-dimensionally-expanded image.

Figure 15:
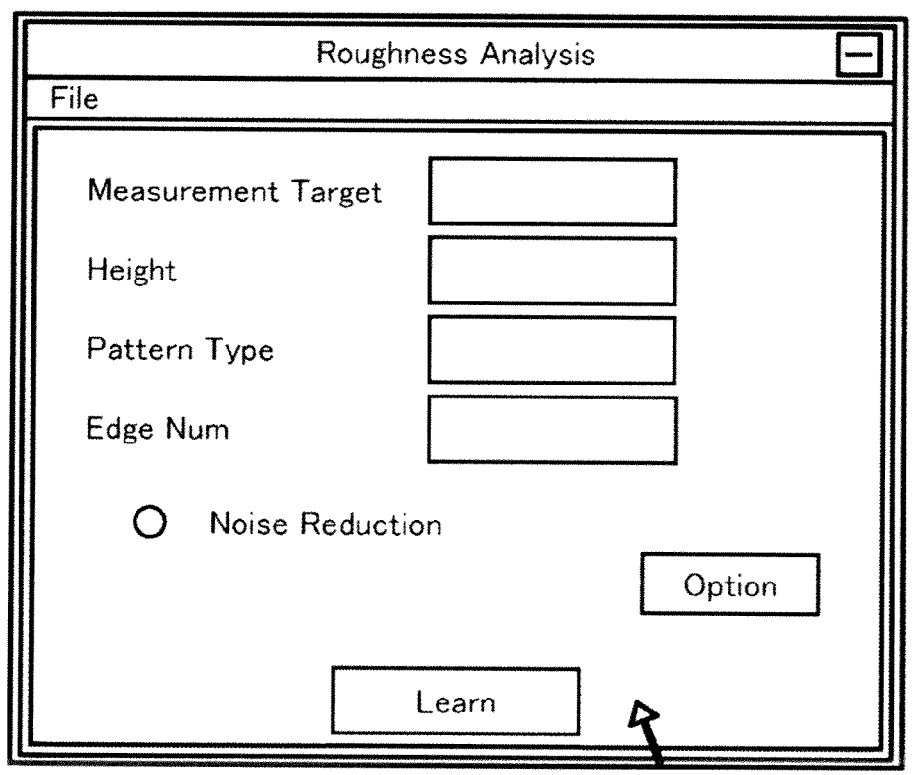

The FIG. 15 is a diagram for illustrating an example of the GUI screen for inputting a condition for making the roughness measurement.

Figure 16:
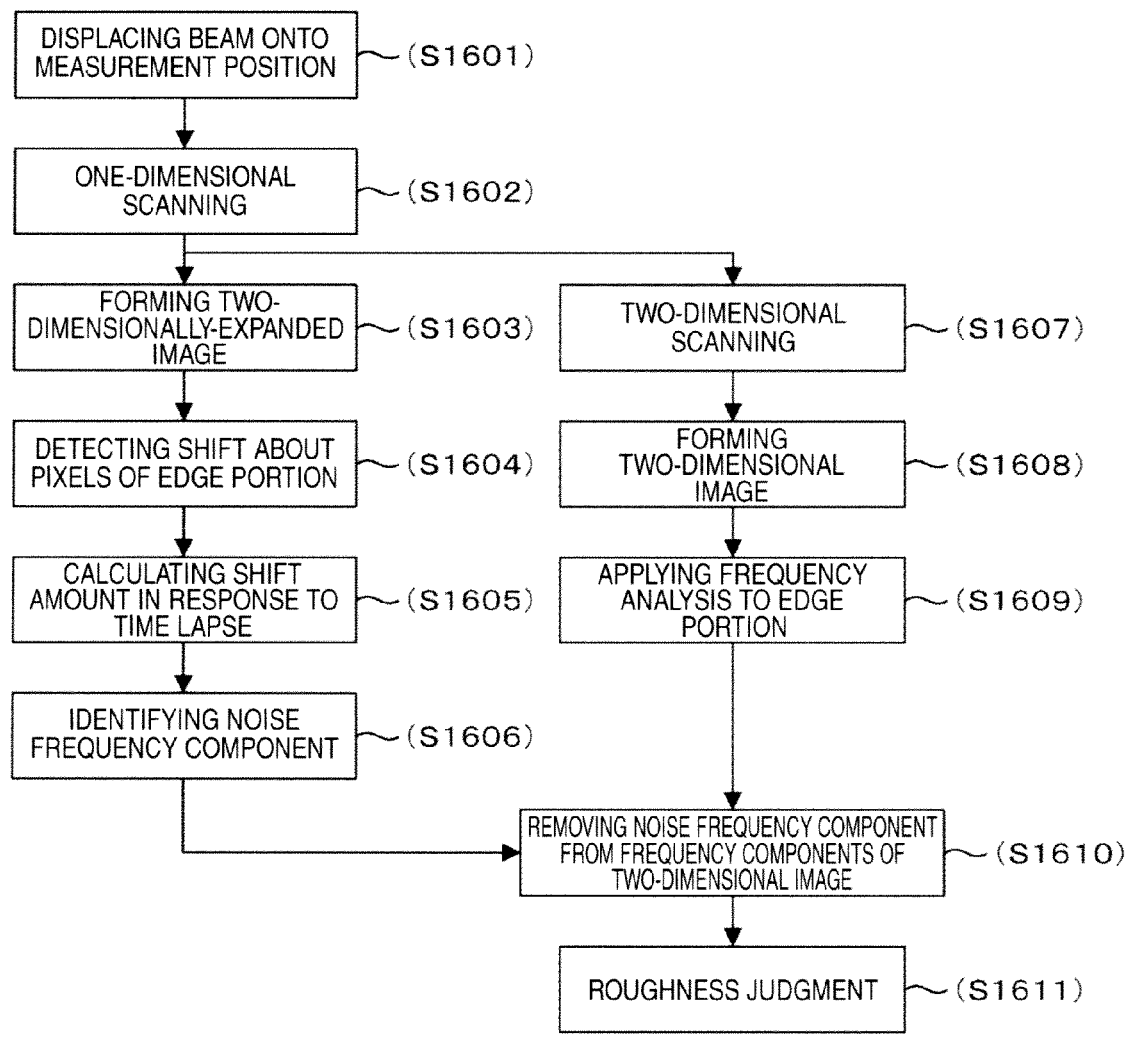

The FIG. 16 is a flowchart for illustrating steps through which the judgment on the roughness is made.

Figure 17:
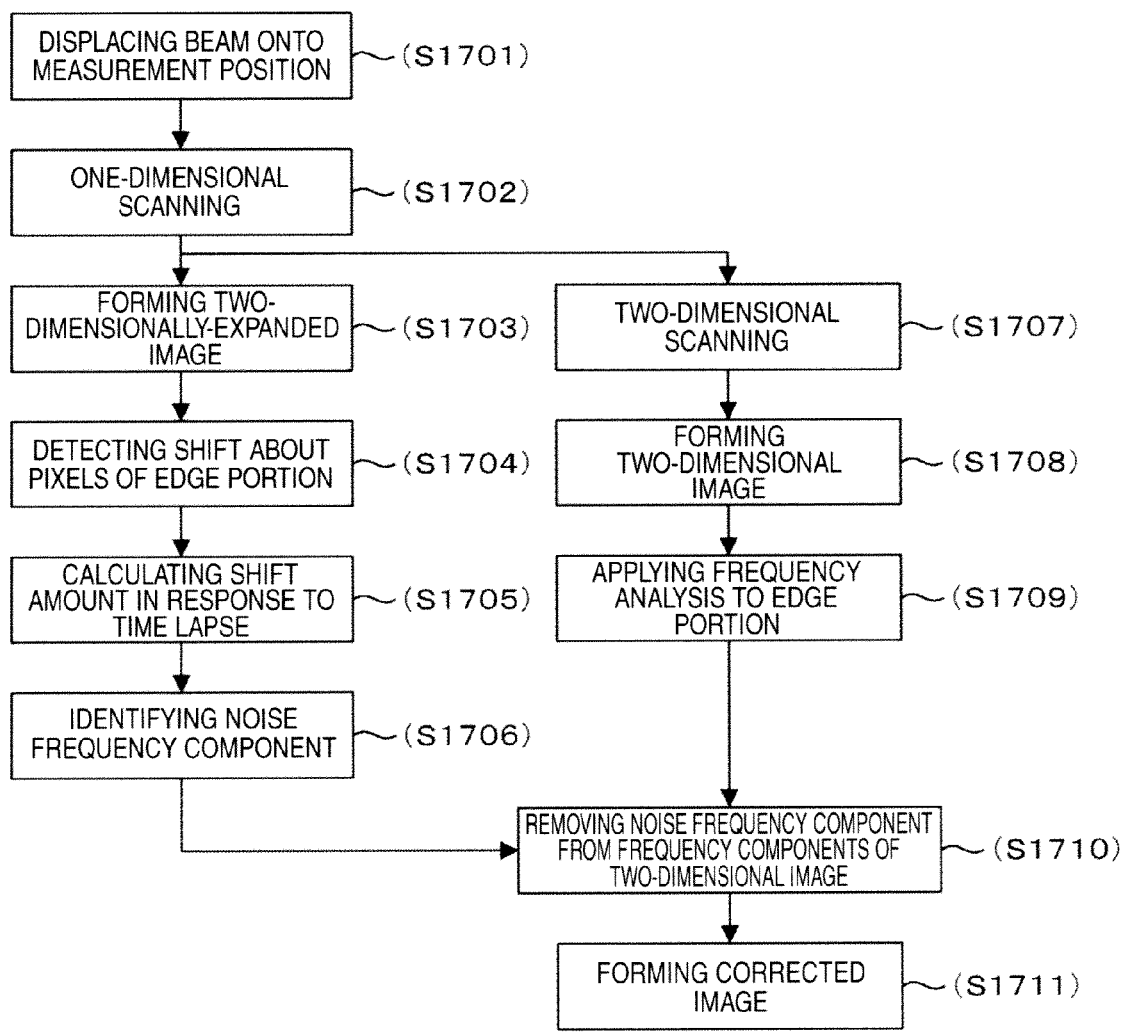

The FIG. 17 is a flowchart for illustrating steps through which the corrected image is formed.

Figure 18:
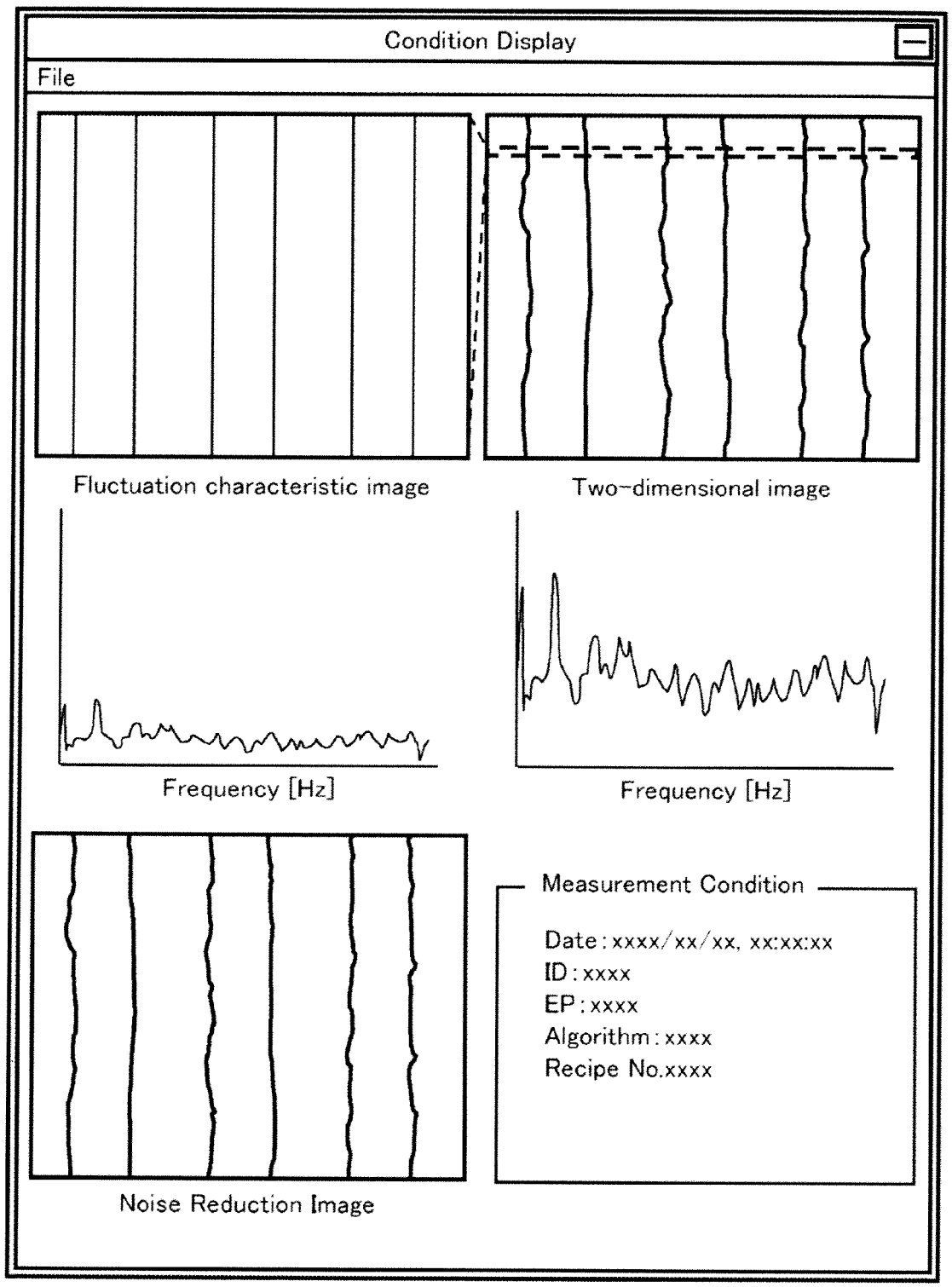

The FIG. 18 is a diagram for illustrating an example of the outputted image in accompaniment with which the SEM image before and after the noise elimination is displayed.

The FIG. 19 is a diagram for illustrating a detectable noise frequency.

DESCRIPTION OF EMBODIMENTS

In embodiments that will be explained hereinafter, the explanation will be given below mainly concerning a device for creating a two-dimensional image in accordance with a processing, and a computer program for causing a computer to execute this processing. Here, this processing is as follows: Namely, first, a one-dimensional scanning is performed in a scanning-line direction (X direction) by setting the Y-direction scanning gain at zero at the time of acquiring a SEM image to be used for the measurement. Simultaneously, the two-dimensional image is created by arranging plural pieces of image information, which are obtained by this one-dimensional scanning, in a time-series manner in the Y direction. According to a more concrete example, shift-amount data on this two-dimensional image is acquired using a correlation function. Moreover, the magnetic field or vibration included within the SEM image is measured by applying a frequency analysis to this shift-amount data. Also, in the embodiments that will be explained hereinafter, the explanation will also be given below regarding the following technique: Namely, an influence exerted by a roughness of the pattern of a SEM image is excluded by setting the Y-direction scanning gain at zero, and performing a reciprocating scanning onto one and the same position. Furthermore, a jitter in the beam scanning direction is made measurable every 600 us by combining with each other the Slow scans (whose scanning time-interval is equal to about 600 us). The magnetic field or vibration included within the SEM image is detected by applying a frequency analysis to the SEM image obtained as described above.

According to the above-described aspect, it becomes possible to exclude the influence exerted by the roughness of the pattern, and to measure the magnetic field and vibration whose frequencies range from low frequencies to comparatively high frequencies, i.e., about 500 Hz.

Figure 1:
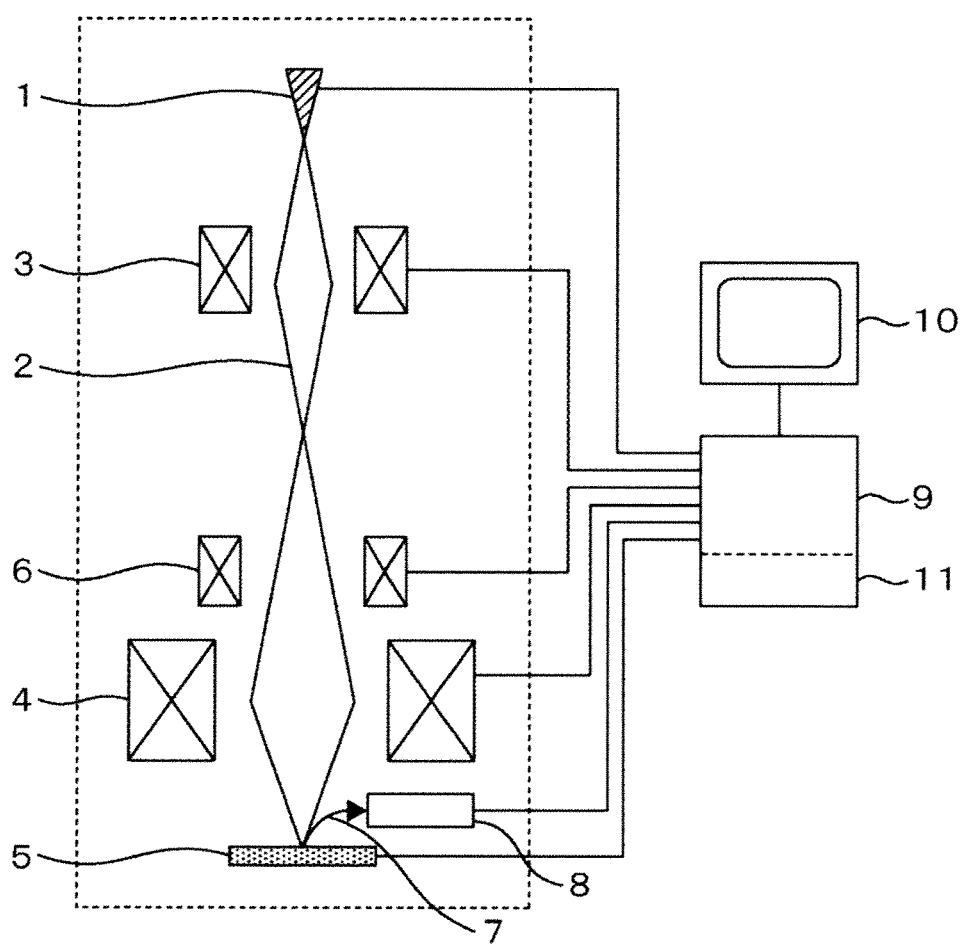

Hereinafter, referring to the drawings, the detailed explanation will be given below concerning the evaluation of a noise, the derivation of corrected data at the time of pattern measurement, or a method and a device which allow implementation of a reduction in the noise, and a computer program for causing a computer to execute these processings. FIG. 1 is a schematic configuration diagram of a scanning electron microscope.

Electrons 2, which are emitted from an electron gun 1, are focused onto a sample 5 by a focus lens 3 and an objective lens 4, then being used for the scanning by a deflector 6. Moreover, secondary particles (such as secondary electrons) 7 are emitted from the sample 5, then being detected by a charged-particle detector 8. A control processor 9 including a computer performs electrical controls over such components as the electron gun 1, the focus lens 3 and the objective lens 4, the deflector 6, the charged-particle detector 8, and the sample 5. A display unit 10 displays a control window for performing the electrical controls, and scanned images.

In the embodiments that will be explained hereinafter, the one-dimensional scanning is made possible by setting the Y-direction scanning gain of the deflector 6 at zero. Furthermore, the obtained SEM image is subjected to the frequency analysis by the control processor 9. Information display about its analysis result is performed by the display unit 10.

FIG. 11 is a schematic diagram of a semiconductor measurement/inspection system including a SEM. The present system includes a SEM's main body 1101, an A/D converter 1104, and a control device 1105.

In the SEM's main body 1101, a sample such as a wafer, on which an electronic device is fabricated, is irradiated with an electron beam. Next, secondary electrons emitted from the sample are captured by a detector 1103, then being converted into a digital signal by the A/D converter 1104. Moreover, the digital signal is inputted into the control device 1105, then being stored into a memory 1107. The digital signal stored therein is subjected to a purpose-responding image processing by image processing hardware such as CPU, ASIC, and FPGA, which are built in a calculation device 1106. Also, the calculation device 1106 is equipped with a function of creating a line profile based on the detection signal, and measuring the dimension between peaks of the line profile.

Furthermore, the control device 1105 is connected to an input-unit-set-up input device 1108. A display device set up on the input device 1108, or an external display 109 is equipped with such functions as the GUI (: Graphical User Interface) function of displaying images and inspection results to the operator.

Incidentally, a partial or entire portion of the controls and processings in the control device 1105 can also be controlled/processed by allocating the partial or entire portion to a computer that installs therein a CPU and an image-accumulation-capable memory. Also, the control device 1105 can also be connected to a photographing-recipe creation device via a network or bus. Here, the photographing-recipe creation device creates a photographing recipe manually, or by utilizing the design data on the electronic device. Also, the photographing recipe includes such data as pattern-matching-dedicated templates and photographing conditions used for the electronic device's coordinate/position determination needed for the inspection.

FIG. 12 is a diagram for illustrating an example where a plurality of SEMs 1201 to 1203 and the photographing-recipe creation device 1204 are connected to each other via a network or bus. The photographing-recipe creation device 1204 allows the photographing recipe of a SEM to be created based on the design data on the semiconductor device stored into a storage medium 1205. The photographing recipe is an operation program that memorizes therein such conditions as measurement position, magnification (i.e., size of field-of-view), and beam condition. In accordance with this operation program, the control device 1105 controls the SEM's main body 1101.

Incidentally, in the embodiments that will be explained hereinafter, the explanation will be given selecting, as its example, a control device that is installed on a scanning electron microscope (: SEM), or a control device (: noise evaluation device) that is connected to the SEM via a communications line or the like. These embodiments, however, are not limited to this example. Namely, a processing that will be described later may also be performed using a general-purpose calculation device for executing an image processing based on a computer program. Furthermore, a technique that will be described later is also applicable to the other charged-particle beam devices such as a focused ion beam (: FIB) device.

Embodiment 1

Figure 2:
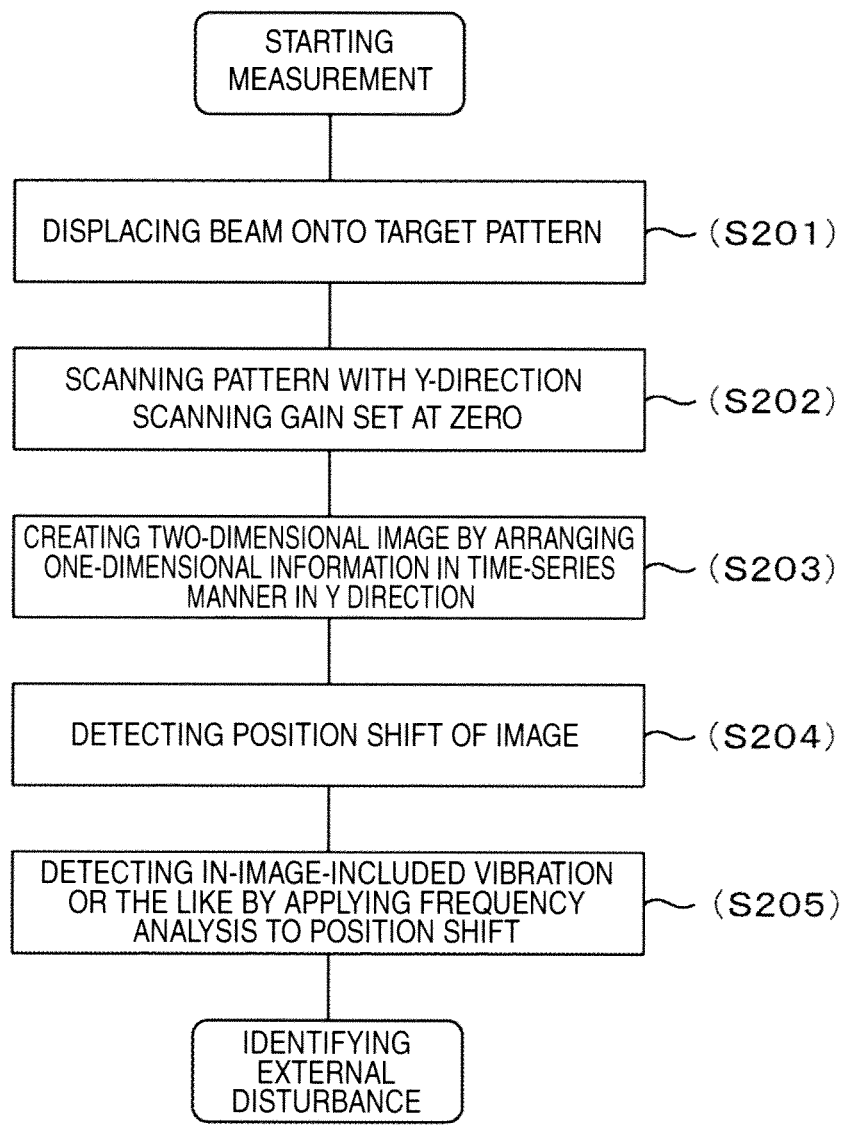

FIG. 2 is a flowchart for explaining steps through which an external disturbance is evaluated by using information that is obtained based on an electron-beam scanning onto a sample. First, a subject sample is mounted on the sample stage of a SEM. After that, the displacement of the sample stage and the deflection of the electron beam are performed so that the field-of-view of the beam is positioned onto a target pattern of the sample (step 201). Next, a one-dimensional scanning with the beam is performed onto the target pattern (step 202). In this case, the pattern is scanned with the deflector's Y-direction scanning gain set at zero. In other words, only the scanning in the X direction is selectively performed in a state where the scanning position in the Y direction is fixed. A one-dimensional scanning like this is carried out as follows: Namely, based on the information stored in advance into the photographing recipe or the like, a deflector control unit 1116 supplies a control signal to the SEM's main body 1101, thereby carrying out the one-dimensional scanning.

Next, a two-dimensional image is created by arranging the one-dimensional information, which is obtained by the above-described one-dimensional scanning, in a time-series manner in the Y direction (step 203). In an image formation unit 1112, the two-dimensionally-expanded image is created as follows: Namely, signals, whose unit is a scanning line or a plurality of scanning lines, are stored into a storage medium such as, e.g., frame memory, in such a manner that the signals are arranged in accordance with the scanning sequence in the Y direction. The two-dimensionally-expanded image is a signal which is obtained without deflecting the beam into the Y direction (i.e., the direction perpendicular to the scanning-line direction), and which is obtained as a result of scanning the same position repeatedly. Accordingly, the image that should be formed from a theoretical point-of-view is an image that exhibits patterns whose dimension values in the X direction are completely identical to each other. Nevertheless, if an external disturbance such as vibration is mixed into the image, the time-elapsed change appears in a manner of having become a change in the edge position. This undesirable situation results in the acquisition of an image whose dimension or edge position has changed, despite the fact that the same position is scanned.

Next, the dimension value or shift amount for each different position in the Y direction is determined with respect to the two-dimensionally-expanded image (step 204). The dimension value can be determined as follows, for example: A line profile is created based on the detection signal. Then, the dimension value can be determined based on the distance between peaks of the line profile. Also, regarding the shift amount, the distance between a predetermined reference position and a peak can be identified as the shift amount. Processings like these may be performed in a signal analysis unit 1113. Otherwise, a dimension measurement unit is set up separately, and the processings may be performed there.

As described above, in the present embodiment, the variation in the dimension value or position like this is represented in the two-dimensional manner. This two-dimensional-mannered representation allows execution of the quantitative evaluation of an external disturbance. For implementing this two-dimensional representation, the change in the X-direction dimension value or edge position in response to the Y-direction position change is detected with respect to the two-dimensionally-expanded image. Each line-segment that appears in the two-dimensionally-expanded image, and that extends in the Y direction becomes a waveform signal where the Y direction denotes time, and where the X direction denotes the shift amount. Consequently, analyzing this waveform signal makes it possible to quantify the external disturbance.

In the signal analysis unit 1113, a frequency analysis is applied to the waveform information obtained. The application of this frequency analysis allows the extraction of a noise component (step 205). Concretely, the spectrum analysis is made, thereby determining a signal amount on each frequency basis. As a more concrete example, the PSD (: Power Spectral Density) is determined. Subsequently, the signal amount and time are stored into the memory 1107, or are displayed on the display device 1109 in such a manner that the signal amount and time are made related with each other on each frequency or frequency-band basis.

As described above, based on the detection of the X-direction position shift obtained from the two-dimensionally-expanded image, the frequency analysis is applied to the position-shift amount. The application of this frequency analysis makes it possible to measure an external disturbance or the like.

Next, the explanation will be given below regarding a method of acquiring a SEM image in the state where the Y-direction scanning gain is set at zero. Setting the Y-direction scanning gain at zero results in no execution of the Y-direction scanning, thereby performing a scanning in only the X direction on the same line. The (a) of the FIG. 3 illustrates an image (150 k) which is acquired by arranging, in a time-series manner, signals obtained by actually setting the Y-direction scanning at zero. The (a) of the FIG. 3 shows that the image acquired with the Y-direction scanning gain set at zero contains none of a pattern roughness. The (b) of the FIG. 3 illustrates an image (100 k) where the position is confirmed by performing a lower-magnification scanning after the one-dimensional scanning is completed. A contamination remain exists in the horizontal direction, which makes it possible to confirm that the same position is scanned with respect to the Y direction.

Next, the explanation will be given below concerning the SEM-image acquisition using the low-speed scanning method (which, hereinafter, will be referred to as "Slow scan"). In order to enhance the S/N ratio of a SEM image, the SEM image is sometimes formed by adding to each other image signals of a plurality of frames. Here, the image signals of a plurality of frames are obtained by performing a plurality of scannings (, when a one-time scanning ranging from the scan start point to the scan end point of a scanning area is defined as a 1 frame). If, however, the SEM image is formed by the frame addition, only a power-supply frequency or its harmonics can be observed. Accordingly, a 1-frame image is used in the present embodiment. Since the SEM image contains a lot of noises, the Slow scan is applied which allows the acquisition of a high-S/N-ratio SEM image. This is because in order to easily implement the edge extraction performed after the SEM-image acquisition.

For example, in the 50-Hz band, the time-interval between two scanning lines of the Slow scan is equal to about 606.94 us. This time-interval corresponds to a condition that the sampling frequency is equal to 1647.6 Hz. The fact that the observable upper-limit frequency is equal to 800 Hz or higher is also the reason why the Slow scan is used. FIG. 19 indicates observable frequencies in a case where the 50-Hz and 60-Hz Slow scans are used. It is conceivable that, although the observable lower-limit frequency depends on the frame time, the observable lower-limit frequency component is a low-frequency component of about 20 Hz.

Detecting the vibration component included in the SEM image requires that the edge in the X direction be detected. Actually, however, it is difficult to detect the edge from an on-1-line-basis signal. In view of this situation, the method that should be used is a method of detecting a jitter by using the correlation method.

First, a projection (i.e., profile) of the entire image area into the X direction is acquired. This projection is defined as an average profile, being stored into the memory 1107 simultaneously. After that, the position shift between each on-1-line-basis signal and the average profile is calculated by the signal analysis unit 1113, thereby determining a jitter for each line. FIG. 4 illustrates examples of the average profile and a I-line profile which are determined.

A correlation function is utilized for calculating the position-shift amount between the average profile and each on-1-line-basis signal. It becomes possible to determine the position-shift amount equipped with a sub-pixel accuracy as follows: Namely, the correlation with the average profile is calculated while perturbing a 1-line image. Subsequently, 2-point data before and after the time when the correlation value becomes the maximum, i.e., 5-point data in total, is subjected to a quadratic-function approximation. This calculation process allows the determination of the position-shift amount equipped with the sub-pixel accuracy. The correlation-coefficient string determined includes no noise, and thus can be easily approximated using the quadratic function.

FIG. 5 illustrates an example where the relative position-shift amount from the average profile is calculated with respect to all of the lines within the image. In the example in FIG. 5, as illustrated in (1), the relative position-shift amount is calculated by using a central area excluding right and left 100-pixel areas. FIG. 5 shows that the position shift in the sub-pixel unit is detected. Partially enlarging the position shift also shows that the position shift exhibits a periodic change.

The frequency analysis is applied to the data on the position-shift amount in FIG. 5. The application of this frequency analysis makes it possible to measure a vibration or the like included in the SEM image. FIG. 6 shows that there occur a 50-Hz noise, i.e., the power-supply frequency, and a 150-Hz noise, i.e., a third harmonics. Also, a 282-Hz noise is detected which is considered to be a vibration.

As described above, the proper evaluation of noises is made executable. This feature allows execution of the evaluation of the set-up environment of a scanning electron microscope or the like. As a consequence, it becomes possible to take some countermeasures such as exclusion of a factor that lowers the accuracy of the measurement or inspection.

Embodiment 2

By rotating the scanning direction by the amount of 90° using the deflector control unit 1116, it becomes possible to detect a noise that operates in the Y direction. FIG. 7 illustrates influences that are exerted onto the SEM image by noises in the X direction and the Y direction. What are referred to as "the X direction and the Y direction" here are not the X direction and the Y direction on the screen, but the X direction and the Y direction of the sample stage. In the semiconductor critical-dimension measurement device, the demand for the two-dimensional measurement is now becoming increasingly strong. Namely, by measuring and correcting the noises from both of the directions, it becomes possible to make the critical-dimension measurement on a pattern dimension in accompaniment with a high accuracy.

Embodiment 3

The measurement in the first embodiment is automatically made in a periodical manner, e.g., every other day. Moreover, the device state is confirmed on a long-term basis. This measurement scheme makes it possible to maintain the stable beam's state. Also, an arbitrary threshold value is set for an intolerable magnitude of noises. Then, if a noise is measured whose magnitude is larger than this threshold value, an error message is displayed on the display. This measurement scheme makes it possible to detect an abnormality of the device earlier. Also, this scheme makes it possible to prevent a lowering in the operability of the device. FIG. 8 illustrates a flowchart of the present measurement scheme.

First of all, the steps up to steps 801 to 805 are basically the same as the steps 201 to 205 in FIG. 2. Namely, the noise detection is made based on the one-dimensional scanning. A threshold value for noise amounts is stored into the memory 1107 in advance. Moreover, a comparison unit 1114 makes a comparison between the threshold value stored, and the noise amount obtained by the signal analysis unit 1113. By making this comparison, the comparison unit 1114 makes a judgment as to whether or not the noise amount exceeds the threshold value. Then, if it is judged that the noise amount exceeds the threshold value, an output-data creation unit 1115 issues an error message via the display device 1109 or the like (step 806). This error message may also be issued, if the signal amount of a specific frequency exceeds a predetermined value, or if the addition signal amount of a plurality of frequency bands exceeds a predetermined value.

An evaluation-condition setting unit 1110 is built in the control device 1105 exemplified in FIG. 11. Based on the input condition from the input device 1108, the evaluation-condition setting unit 1110 sets noise evaluation conditions, then registering the noise evaluation conditions into the memory 1107 as an evaluation recipe. Concretely, the setting unit 1110 causes the display device 1109 or the like to display the GUI (: Graphical User Interface) screen, then performing the evaluation-condition setting on this GUI screen.

FIG. 13 is a diagram for illustrating an example of the GUI screen for performing the condition setting for the noise evaluation. The noise evaluation conditions that are made selectable on this GUI screen are as follows: Namely, timing with which the noise evaluation is to be performed, pattern type and threshold value to be used for the noise evaluation, and whether or not the error message is to be issued. On the GUI screen exemplified in FIG. 13, the timing with which the noise evaluation is to be performed is set as "Daily". This setting means that the noise evaluation is to be performed at a predetermined point-in-time every other day. Based on the setting on the GUI screen like this, the evaluation-condition setting unit 1110 creates the evaluation recipe, i.e., the operation program for causing the SEM to operate.

FIG. 14 is a diagram for explaining the following example: Namely, in this example, changes in the signal amounts of specific frequencies, which are obtained based on the obtained two-dimensionally-expanded image, are displayed on a graph whose transverse axis denotes time and date. Namely, in FIG. 14, the triangles denote frequency A, the circles denote frequency B, the squares denote frequency C, and the cross shapes denote frequency D. This displayed data is created by the output-data creation unit 1115, then being displayed on the display device 1109 or the like.

According to the configuration as described above, it becomes possible to implement the setting for performing the evaluation of the device's condition in association with a proper timing.

Embodiment 4

A database for storing the combination of the frequencies of noises and the causes for these noises is created, then being stored into the memory 1107. The utilization of this database allows the operator of the device to know the noise causes themselves. Here, the operator is allowed to know the causes on the basis of the per-peak identification of the frequencies of the noise causes detected in the first embodiment. Noises that are expectable are as follows, for example: Harmonics whose frequencies are integral multiple of 50 Hz and 60 Hz, i.e., the power-supply frequencies, the stage natural frequency of a stage, and the column natural frequency.

This database is created by performing the evaluation beforehand using the simulation or a real machine. Also, the present measurement is made periodically. Then, if there occurs a noise that is not found in the database, or if there occurs a noise that has been not detected so far, an error message is outputted to the monitor. This error message informs the operator of the device's abnormality. FIG. 9 illustrates a flowchart of the present measurement scheme.

First of all, the steps up to steps 901 to 905 are basically the same as the steps 201 to 205 in FIG. 2. Namely, the noise detection is made based on the one-dimensional scanning. Next, reference is made to a database where the in-advance registered frequencies of noises and the noise causes for these noises are stored in a manner of being made related with each other (step 906), thereby identifying the noise causes (step 907). The noise causes like this are displayed on the display device 1109. This display of the noise causes allows the operator to easily grasp suspicious events as candidates of the noise causes.

Also, if, even though reference is made to the database, whatever noise cannot be identified from among the specific frequency components whose signal amounts are larger than a predetermined amount, it is judged that an unknown noise has occurred. Accordingly, an error message is displayed on the display device 1109 (step 908). In this way, when the unknown noise is mixed in, a notice to the effect is displayed on the display device 1109 (step 909). This notice is intended to prompt the operator to update the database. Then, if the noise cause can be identified from the occurrence time or magnitude of the unknown noise, the operator can update the database by storing the unknown noise and the noise cause into the database in a manner of being made related with each other.

Embodiment 5

In the above-described embodiment, the explanation has been given concerning the technique for monitoring the device state and the set-up environment. Meanwhile in the present embodiment, the explanation will be given below regarding a technique for correcting an image to be obtained on the basis of the noise information obtained. Concretely, a deflection signal that will cancel out the noise detected as described above is created by the deflector control unit 1116. Moreover, the correction signal created and the scanning signal are superimposed on each other, then being supplied to the deflector 1102. This scheme allows the formation of a noiseless image. In the present embodiment, the detected noise is feed-backed to the deflector 6 in FIG. 1, thereby controlling the beam so that the noise will be canceled out. The correction of the noise is made in this way.

Also, the measurement on the noise is carried out periodically in accompaniment with a certain constant time-interval. This scheme makes it possible to execute the high-accuracy correction always. It is conceivable, however, that an unexpected and sudden external disturbance occurs at the time of the measurement. In view of this situation, the correction signal is created as follows: Namely, the measurement results in the past are stored beforehand on each frequency basis. Furthermore, noise information that had been detected over a few times continuously in the past is selectively used, thereby creating the correction signal. FIG. 10 illustrates a flowchart of the present measurement scheme.

First of all, the steps up to steps 1001 to 1005 are basically the same as the steps 201 to 205 in FIG. 2. Namely, the noise detection is made based on the one-dimensional scanning. Next, the signals on each frequency basis, which are obtained by the frequency analysis, are listed up (step 1006). Moreover, the signals are added to the occurrence number-of-times obtained based on the measurement results in the past, thereby calculating the occurrence number-of-times in total (step 1007).

It is conceivable that a noise, whose accumulated occurrence number-of-times is larger than a predetermined occurrence number-of-times, is not the unexpected and sudden external disturbance, but the noise that had occurred over a few times continuously in the past. Accordingly, the frequency and signal amount of this noise are identified (step 1008). Furthermore, the deflector control unit 1116 creates a deflection signal for canceling out this noise (step 1009). In addition, this correction signal is superimposed on the scanning signal, then performing the beam scanning. This scheme makes it possible to execute the high-accuracy image formation, or measurement.

Embodiment 6

In the present embodiment, the explanation will be given below concerning a technique for forming an image from which the influence exerted by a noise is excluded. Here, the exclusion of the noise is implemented not by correcting the deflection signal, but by adjusting the pixel position in response to the evaluation value of the noise. FIG. 17 is a flowchart for illustrating steps through which the corrected image is formed. In the present embodiment, the beam-irradiation position is displaced onto a noise-evaluation position (step 1701). After that, a one-dimensional scanning with the beam is performed onto the measurement position (step 1702). Next, a two-dimensionally-expanded image is created by making a two-dimensional arrangement of image signals obtained by the one-dimensional scanning (step 1703). Moreover, the shift at different-height (i.e., Y direction) positions is determined based on this two-dimensionally-expanded image (step 1704). Furthermore, the transition (i.e., waveform) of the shift amount corresponding to a time lapse (i.e., scanning number-of-times) is determined (step 1705). Finally, the frequency analysis is applied to this waveform. The application of this frequency analysis makes it possible to extract a frequency component whose occurrence number-of-times is larger than a predetermined occurrence number-of-times as explained in the fifth embodiment. In this way, the noise component is identified (step 1706).

Meanwhile, a two-dimensional image is formed (step 1708) by performing a two-dimensional scanning with the electron beam onto the target pattern on the sample (step 1707). Moreover, the frequency analysis is applied to the edge portion displayed on this two-dimensional image. The application of this frequency analysis makes it possible to identify frequency components whose signal amounts are larger than a predetermined amount (step 1709). Furthermore, the frequency component that is identified as the noise at the step 1706 is removed from the frequency components whose signal amounts are identified as being larger than the predetermined amount at the step 1709 (step 1710). Finally, the two-dimensional image is reconstructed based on the after-noise-removal signals (step 1711).

According to the configuration as described above, it becomes possible to construct a proper two-dimensional image while suppressing the influence exerted by a noise or the like. Also, the two-dimensional image formed at the step 1708 and the two-dimensional image reconstructed at the step 1711 are outputted together onto the display device or the like. This output makes it possible to check whether or not the noise removal is performed properly.

FIG. 18 is a diagram for illustrating an example of the outputted image on which the SEM images before and after the noise removal are displayed together. The data displayed on this outputted image are as follows: The two-dimensionally-expanded image, i.e. a fluctuation characteristic image, that is created by two-dimensionally expanding the signals obtained by the one-dimensional scanning, the frequency-analysis result at the time of the one-dimensional scanning, the two-dimensional image based on the two-dimensional scanning, the frequency-analysis result at the time of the two-dimensional scanning, the two-dimensional image after the noise removal, and the measurement condition at the time of the frequency analyses.

According to the display mode like this, it becomes possible to visually confirm the occurrence situation of a noise. As a result, it becomes possible to easily grasp whether the roughness of the edge portion of the two-dimensional image is attributed to the noise, or the roughness represents the pattern shape itself. Also, the after-noise-removal image is displayed together. This display mode makes it possible to confirm whether or not the noise removal is performed properly (or, whether or not the roughness information that should be evaluated is eliminated by the noise removal).

FIG. 16 is a flowchart for illustrating steps through which the judgment on a roughness (i.e., step 1611) is made instead of forming the two-dimensional image on the basis of the noise removal. The steps up to steps 1601 to 1610 are basically the same as the steps 1701 to 1710 in FIG. 17. For example, if the roughness evaluation alone is made, an approximate function is determined based on the line-segment of the after-noise-removal edge. Moreover, the roughness measurement is made based on the distance between this approximate function and the edge line-segment. The result of this measurement is registered into the memory 1107. Also, FIG. 15 is a diagram for illustrating an example of the GUI screen for inputting conditions for making the roughness measurement. These conditions include Measurement Target, Height, Pattern Type, and Edge Num in the case where a plurality of edges are included. A button for making a selection as to whether or not to perform the noise removal is set up inside the GUI screen. The set-up of the option like this allows the implementation of a selection as to whether priority is given to the removal of an external disturbance, or priority is given to the signal amount based on the non-removal of the specific-frequency signal.

Embodiment 7

Next, the explanation will be given below concerning a technique that is preferable for evaluating machine differences among a plurality of SEMs. Now, consideration is given to the case of the measurement/inspection device that, as exemplified in FIG. 12, includes the plurality of SEMs 1201 to 1203. In this case, if a machine difference exists between the respective devices, it turns out that, even if one and the same measurement target is measured, different measurement values are outputted. This situation becomes a cause for giving rise to a lowering in the measurement reproducibility. Accordingly, in the present embodiment, in order to suppress the machine difference like this, the following measurement scheme is given in each SEM: Namely, the evaluation of the device condition is carried out as is carried out in the above-described embodiments. Moreover, the correction signal for the deflector, or the correction condition for the image is calculated so that the machine difference is suppressed. Concretely, it is preferable to decide a SEM (e.g., the SEM 1201) that becomes a reference SEM, and to adjust the deflector correction signal or image correction condition for the other SEMs 1202 and 1203 so that it becomes the same as the one for the SEM 1201. The adjustment of the SEM 1201 is made in advance in accordance with the device adjustment based on the techniques exemplified in the above-described embodiments. Furthermore, the condition for the other SEMs is so controlled as to follow the condition for the SEM 1201. This adjustment scheme makes it possible to suppress the machine difference.

Incidentally, there exists the following possibility: Namely, the noise state changes, depending on a timing with which the one-dimensional scanning is performed. Accordingly, in order to make the evaluation of each device under the same noise condition, it is desirable to make the noise detection by performing the one-dimensional scanning simultaneously in the plurality of SEMs. Also, if a significant noise is detected only in a certain specific device, it is conceivable that this significant noise is attributed to a cause (e.g., a noise source is set up in proximity to the SEM, the set-up environment changes thereby to generate the noise, or the like) that is characteristic of this specific device. Consequently, if the departure (e.g., the signal amount of a specific frequency, or the signal amount of a frequency that is not confirmed in the reference device) of the noise information from the reference device exceeds a predetermined value, it is advisable to issues a warning.

According to the configuration like this, it becomes possible to recognize a change in the device environment early, and thus to take some countermeasures against this change.

Also, the execution of the accurate correction requires that the correction amounts be identified with the same magnification. Accordingly, it is desirable to make the noise evaluation in the plurality of SEMs by using one and the same reference sample whose dimension value has been already known. However, if the frequency component that becomes the noise source is merely wished to be identified, the techniques can be separately used depending on the usage. This is because the above-described embodiment can extract the frequency component regardless of the pattern's dimension. In this case, the noise removal may also be performed by applying a filtering to the identified frequency component. However, in order to perform the noise detection and the correction signal's calculation with a high accuracy, it is desirable to make the noise evaluation among the plurality of devices by using reference samples that are created simultaneously and in accordance with the same standard.

According to the evaluation method like this, it becomes possible to selectively detect only a noise source that exhibits none of time-wise variation factors, and that is originated from the device's set-up situation and condition.

The processings as described so far are performed in batch by the photographing-recipe creation device 1204. This scheme makes it possible to easily manage the noise-originated machine differences. In the case of the present embodiment, the photographing-recipe creation device 1204 functions as an image analysis device.

Also, in the above-described embodiments, the explanation has been given on the assumption that the noise factor is mainly the external disturbance such as vibration. If, however, such factors as, e.g., electrification of the sample causes the image to generate its characteristic fluctuation, the sample may also be identified as a sample-material-characteristic noise source. Subsequently, such operations as the noise evaluation and correction signal's calculation may also be performed based on this identification.

The above-described description has been given in accompaniment with the embodiments. It is apparent for those who are skilled in the art, however, that the present invention is not limited thereto, and that a variety of modifications and amendments can be made within the spirit of the present invention and the scope of the appended claims.

REFERENCE SIGNS LIST

1 Electron gun
2 Electrons
3 Focus lens
4 Objective lens
5 Sample
6 Deflector
7 Secondary particles
8 Charged-particle detector
9 Control processor
10 Display unit

The invention claimed is:

1. A charged-particle beam device, comprising:
   a charged-particle source;
   a deflector which performs a scanning with a beam, said beam being emitted from said charged-particle source; and
   an image formation unit which forms an image on the basis of charged particles emitted from a sample, wherein
   said image formation unit forms a two-dimensional image by expanding signals in a two-dimensional manner, said signals being obtained when said deflector performs said scanning with said beam in a one-dimensional manner and in plural times.

2. The charged-particle beam device according to claim 1, further comprising:
   a signal analysis unit which applies a frequency analysis to waveform information indicating edge of said two-dimensional image.

3. The charged-particle beam device according to claim 2, wherein
   said signal analysis unit detects a signal amount for each frequency component that is obtained based on said frequency analysis.

4. The charged-particle beam device according to claim 2, further comprising:
   an output-data creation unit which outputs information about a frequency-analysis result when said frequency-analysis result becomes a predetermined condition, said frequency-analysis result being obtained by said signal analysis unit.

5. The charged-particle beam device according to claim 2, wherein
   said signal analysis unit outputs noise-related information which is memorized in a manner that an obtained frequency-analysis result is related with frequency components obtained by making reference to a database registered in advance.

6. The charged-particle beam device according to claim 1, wherein
   said image formation unit forms at least two two-dimensional images on the basis of charged particles, said charged particles being detected by said deflector's performing said scanning with said beam in two different directions and in a one-dimensional manner.

7. The charged-particle beam device according to claim 1, wherein
   said image formation unit forms a plurality of images on the basis of charged particles, said charged particles being obtained by performing a periodic one-dimensional scanning with said beam.

8. The charged-particle beam device according to claim 1, further comprising:

a signal analysis unit which applies a frequency analysis to waveform information indicating edge of said two-dimensional image; and a deflector control unit which controls said deflector so that a noise component detected by said signal analysis unit is eliminated.

9. The charged-particle beam device according to claim 1, further comprising:

a signal analysis unit which applies a frequency analysis to waveform information indicating edge of said two-dimensional image, wherein said image formation unit forms said image after eliminating a noise component detected by said signal analysis unit.

* * * * *